(12) United States Patent
Fuhs

(10) Patent No.: US 12,355,409 B2
(45) Date of Patent: Jul. 8, 2025

(54) VARIABLE GAIN AMPLIFIER WITH CROSS-COUPLED COMMON MODE REDUCTION

(71) Applicant: Kandou Labs SA, Lausanne (CH)

(72) Inventor: Maik Fuhs, Kierspe (DE)

(73) Assignee: Kandou Labs SA, Lausanne (CH)

( * ) Notice: Subject to any disclaimer, the term of this patent is extended or adjusted under 35 U.S.C. 154(b) by 616 days.

(21) Appl. No.: 17/702,884

(22) Filed: Mar. 24, 2022

(65) Prior Publication Data

US 2023/0308064 A1 Sep. 28, 2023

(51) Int. Cl.
*H03F 3/45* (2006.01)
*H03D 7/14* (2006.01)

(52) U.S. Cl.
CPC ....... *H03F 3/45475* (2013.01); *H03D 7/1458* (2013.01)

(58) Field of Classification Search
CPC ....... H03F 3/45475; H03F 2203/45506; H03F 3/45744; H03F 3/72; H03F 3/45183; H03F 3/45179; H03F 3/45192; H03F 3/45089; H03F 3/45; H03D 7/1458; H04L 25/03146; H03G 1/0029
USPC ................................................. 330/253, 254
See application file for complete search history.

(56) References Cited

U.S. PATENT DOCUMENTS

| | | |
|---|---|---|
| 3,636,463 A | 1/1972 | Ongkiehong |
| 3,824,494 A | 7/1974 | Wilcox |
| 3,939,468 A | 2/1976 | Mastin |
| 4,276,543 A | 6/1981 | Miller et al. |
| 4,774,498 A | 9/1988 | Traa |
| 4,897,657 A | 1/1990 | Brubaker |
| 5,017,924 A | 5/1991 | Guiberteau et al. |
| 5,045,804 A | 9/1991 | Sugawara et al. |

(Continued)

FOREIGN PATENT DOCUMENTS

| | | |
|---|---|---|
| CN | 104242839 A | 12/2014 |
| EP | 0425064 A2 | 5/1991 |

(Continued)

OTHER PUBLICATIONS

International Search Report and Written Opinion for PCT/US2023/016075, Jul. 11, 2023, 1-13 (13 pages).

(Continued)

*Primary Examiner* — Khanh V Nguyen

(57) ABSTRACT

Methods and systems for receiving a differential input voltage signal at an input of a variable gain amplifier, and responsively generating an amplified differential output voltage signal on a pair of output nodes by driving a pair of load impedances connected to the pair of output nodes with an amplifier current according to the differential input voltage signal, enabling a cross-coupled differential pair connected in parallel to the pair of load impedances, the cross-coupled differential pair having drain inputs and cross-coupled gate inputs connected to the pair of output nodes to supplement a gain of the amplified differential voltage output voltage signal, and reducing a common mode voltage of the amplified differential output voltage signal by lowering the amplifier current driving the pair of load impedances via a bias control signal, the amplifier current lowered responsive to detecting the supplemented gain of the amplified differential output voltage signal.

18 Claims, 9 Drawing Sheets

(56) References Cited

U.S. PATENT DOCUMENTS

| | | | |
|---|---|---|---|
| 5,196,737 A * | 3/1993 | Olmstead | H03K 3/35606 |
| | | | 327/63 |
| 5,459,465 A | 10/1995 | Kagey | |
| 5,510,736 A | 4/1996 | Van | |
| 5,748,948 A | 5/1998 | Yu et al. | |
| 5,777,568 A | 7/1998 | Inoue | |
| 5,793,254 A | 8/1998 | OConnor | |
| 5,945,935 A | 8/1999 | Kusumoto et al. | |
| 6,094,075 A | 7/2000 | Garrett et al. | |
| 6,157,257 A | 12/2000 | Murphy | |
| 6,226,330 B1 | 5/2001 | Mansur | |
| 6,232,908 B1 | 5/2001 | Nakaigawa | |
| 6,346,907 B1 | 2/2002 | Dacy et al. | |
| 6,384,758 B1 | 5/2002 | Michalski et al. | |
| 6,396,329 B1 | 5/2002 | Zerbe | |
| 6,400,302 B1 | 6/2002 | Amazeen et al. | |
| 6,462,584 B1 | 10/2002 | Proebsting | |
| 6,546,063 B1 | 4/2003 | Lee et al. | |
| 6,563,382 B1 | 5/2003 | Yang | |
| 6,624,699 B2 | 9/2003 | Yin et al. | |
| 6,839,587 B2 | 1/2005 | Yonce | |
| 6,879,816 B2 | 4/2005 | Bult et al. | |
| 6,888,483 B2 | 5/2005 | Mulder | |
| 6,972,701 B2 | 12/2005 | Jansson | |
| 7,075,473 B2 | 7/2006 | McGowan | |
| 7,075,996 B2 | 7/2006 | Simon et al. | |
| 7,151,409 B2 * | 12/2006 | Koen | H03G 1/0029 |
| | | | 330/288 |
| 7,167,523 B2 | 1/2007 | Mansur | |
| 7,188,199 B2 | 3/2007 | Leung et al. | |
| 7,199,728 B2 | 4/2007 | Dally et al. | |
| 7,269,212 B1 | 9/2007 | Chau et al. | |
| 7,285,977 B2 | 10/2007 | Kim | |
| 7,372,295 B1 | 5/2008 | Wei | |
| 7,372,390 B2 | 5/2008 | Yamada | |
| 7,397,302 B2 | 7/2008 | Bardsley et al. | |
| 7,425,866 B2 * | 9/2008 | Kocaman | H03G 1/0088 |
| | | | 330/253 |
| 7,528,758 B2 | 5/2009 | Ishii | |
| 7,560,957 B2 | 7/2009 | Chen et al. | |
| 7,598,811 B2 | 10/2009 | Cao | |
| 7,635,990 B1 | 12/2009 | Ren et al. | |
| 7,656,321 B2 | 2/2010 | Wang | |
| 7,683,720 B1 | 3/2010 | Yehui et al. | |
| 7,688,102 B2 | 3/2010 | Bae et al. | |
| 7,688,887 B2 | 3/2010 | Gupta et al. | |
| 7,697,915 B2 | 4/2010 | Behzad et al. | |
| 7,804,361 B2 | 9/2010 | Lim et al. | |
| 7,822,113 B2 | 10/2010 | Tonietto et al. | |
| 7,957,472 B2 | 6/2011 | Wu et al. | |
| 8,000,664 B2 | 8/2011 | Khorram | |
| 8,030,999 B2 | 10/2011 | Chatterjee et al. | |
| 8,106,806 B2 | 1/2012 | Toyomura et al. | |
| 8,159,375 B2 | 4/2012 | Abbasfar | |
| 8,159,376 B2 | 4/2012 | Abbasfar | |
| 8,183,930 B2 | 5/2012 | Kawakami et al. | |
| 8,537,886 B1 | 9/2013 | Shumarayev et al. | |
| 8,547,272 B2 | 10/2013 | Nestler et al. | |
| 8,581,824 B2 | 11/2013 | Baek et al. | |
| 8,604,879 B2 | 12/2013 | Mourant et al. | |
| 8,643,437 B2 | 2/2014 | Chiu et al. | |
| 8,674,861 B2 | 3/2014 | Matsuno et al. | |
| 8,687,968 B2 | 4/2014 | Nosaka et al. | |
| 8,704,583 B2 | 4/2014 | Bulzacchelli et al. | |
| 8,791,735 B1 | 7/2014 | Shibasaki | |
| 8,841,936 B2 | 9/2014 | Nakamura | |
| 8,860,590 B2 | 10/2014 | Yamagata et al. | |
| 8,861,583 B2 | 10/2014 | Liu | |
| 9,069,995 B1 | 6/2015 | Cronie | |
| 9,100,232 B1 | 8/2015 | Hormati et al. | |
| 9,106,462 B1 | 8/2015 | Aziz et al. | |
| 9,106,465 B2 | 8/2015 | Walter | |
| 9,148,087 B1 | 9/2015 | Tajalli | |
| 9,178,503 B2 | 11/2015 | Hsieh | |
| 9,281,785 B2 | 3/2016 | Sjöland | |
| 9,281,974 B1 | 3/2016 | Liu | |
| 9,292,716 B2 | 3/2016 | Winoto et al. | |
| 9,300,503 B1 | 3/2016 | Holden et al. | |
| 9,473,330 B1 | 10/2016 | Francese | |
| 9,577,815 B1 | 2/2017 | Simpson et al. | |
| 9,705,708 B1 | 7/2017 | Jin et al. | |
| 9,722,604 B2 * | 8/2017 | Cho | H03K 19/09432 |
| 9,743,196 B2 | 8/2017 | Kropfitsch | |
| 9,755,599 B2 | 9/2017 | Yuan et al. | |
| 9,780,979 B2 | 10/2017 | Sun et al. | |
| 9,954,495 B1 | 4/2018 | Chen et al. | |
| 10,003,315 B2 | 6/2018 | Tajalli | |
| 10,326,623 B1 | 6/2019 | Tajalli | |
| 2001/0006538 A1 | 7/2001 | Simon et al. | |
| 2002/0050861 A1 | 5/2002 | Nguyen et al. | |
| 2002/0149508 A1 | 10/2002 | Hamashita | |
| 2002/0158789 A1 | 10/2002 | Yoshioka et al. | |
| 2002/0174373 A1 | 11/2002 | Chang | |
| 2003/0016763 A1 | 1/2003 | Doi et al. | |
| 2003/0085763 A1 | 5/2003 | Schrodinger et al. | |
| 2003/0132791 A1 | 7/2003 | Hsieh | |
| 2003/0160749 A1 | 8/2003 | Tsuchi | |
| 2003/0174023 A1 | 9/2003 | Miyasita | |
| 2003/0184459 A1 | 10/2003 | Engl | |
| 2003/0218558 A1 | 11/2003 | Mulder | |
| 2004/0027185 A1 | 2/2004 | Fiedler | |
| 2004/0169529 A1 | 9/2004 | Afghahi et al. | |
| 2004/0232980 A1 | 11/2004 | Jantzi et al. | |
| 2005/0008099 A1 | 1/2005 | Brown | |
| 2005/0057379 A1 | 3/2005 | Jansson | |
| 2005/0218980 A1 | 10/2005 | Kalb | |
| 2005/0270098 A1 | 12/2005 | Zhang et al. | |
| 2006/0036668 A1 | 2/2006 | Jaussi et al. | |
| 2006/0097786 A1 | 5/2006 | Su et al. | |
| 2006/0103463 A1 | 5/2006 | Lee et al. | |
| 2006/0192598 A1 | 8/2006 | Baird et al. | |
| 2006/0194598 A1 | 8/2006 | Kim et al. | |
| 2007/0009018 A1 | 1/2007 | Wang | |
| 2007/0097579 A1 | 5/2007 | Amamiya | |
| 2007/0104299 A1 | 5/2007 | Cahn et al. | |
| 2007/0159247 A1 | 7/2007 | Lee et al. | |
| 2007/0176708 A1 | 8/2007 | Otsuka et al. | |
| 2007/0182487 A1 | 8/2007 | Ozasa et al. | |
| 2007/0188367 A1 | 8/2007 | Yamada | |
| 2007/0201546 A1 | 8/2007 | Lee | |
| 2007/0285156 A1 | 12/2007 | Roberts et al. | |
| 2008/0001626 A1 | 1/2008 | Bae et al. | |
| 2008/0107209 A1 | 5/2008 | Cheng et al. | |
| 2008/0165841 A1 | 7/2008 | Wall et al. | |
| 2008/0187037 A1 | 8/2008 | Bulzacchelli et al. | |
| 2009/0090333 A1 | 4/2009 | Spadafora et al. | |
| 2009/0115523 A1 | 5/2009 | Akizuki et al. | |
| 2009/0146719 A1 | 6/2009 | Pernia et al. | |
| 2009/0323864 A1 | 12/2009 | Tired | |
| 2010/0148819 A1 | 6/2010 | Bae et al. | |
| 2010/0156691 A1 | 6/2010 | Taft | |
| 2010/0219781 A1 | 9/2010 | Kuwamura | |
| 2010/0235673 A1 | 9/2010 | Abbasfar | |
| 2010/0271107 A1 | 10/2010 | Tran et al. | |
| 2011/0028089 A1 | 2/2011 | Komori | |
| 2011/0032977 A1 | 2/2011 | Hsiao et al. | |
| 2011/0051854 A1 | 3/2011 | Kizer et al. | |
| 2011/0057727 A1 | 3/2011 | Cranford et al. | |
| 2011/0096054 A1 | 4/2011 | Cho et al. | |
| 2011/0103508 A1 | 5/2011 | Mu et al. | |
| 2011/0105067 A1 | 5/2011 | Wilson | |
| 2011/0133816 A1 | 6/2011 | Wu et al. | |
| 2011/0156819 A1 | 6/2011 | Kim et al. | |
| 2012/0025911 A1 | 2/2012 | Zhao et al. | |
| 2012/0044021 A1 | 2/2012 | Yeh et al. | |
| 2012/0133438 A1 | 5/2012 | Tsuchi et al. | |
| 2012/0249217 A1 | 10/2012 | Fukuda et al. | |
| 2013/0106513 A1 | 5/2013 | Cyrusian et al. | |
| 2013/0114663 A1 | 5/2013 | Ding et al. | |
| 2013/0147553 A1 | 6/2013 | Iwamoto | |
| 2013/0195155 A1 | 8/2013 | Pan et al. | |
| 2013/0215954 A1 | 8/2013 | Beukema et al. | |
| 2013/0259113 A1 | 10/2013 | Kumar | |
| 2013/0334985 A1 | 12/2013 | Kim et al. | |

(56) References Cited

U.S. PATENT DOCUMENTS

| | | |
|---|---|---|
| 2014/0119479 A1 | 5/2014 | Tajalli |
| 2014/0176354 A1 | 6/2014 | Yang |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |
| 2016/0013954 A1 | 1/2016 | Shokrollahi et al. |
| 2016/0087610 A1 | 3/2016 | Hata |
| 2016/0197747 A1 | 7/2016 | Ulrich et al. |
| 2017/0005841 A1 | 1/2017 | Komori et al. |
| 2017/0085239 A1 | 3/2017 | Yuan et al. |
| 2017/0104458 A1 | 4/2017 | Cohen et al. |
| 2017/0214374 A1 | 7/2017 | Tajalli |
| 2017/0244371 A1 | 8/2017 | Turker Melek et al. |
| 2017/0302237 A1 | 10/2017 | Akter et al. |
| 2017/0302267 A1 | 10/2017 | Luo |
| 2017/0309346 A1 | 10/2017 | Tajalli et al. |
| 2018/0076985 A1 | 3/2018 | Schell |
| 2019/0199557 A1 | 6/2019 | Taylor et al. |
| 2019/0221153 A1 | 7/2019 | Tsuchi et al. |
| 2019/0379340 A1 | 12/2019 | Rattan et al. |
| 2019/0379563 A1 | 12/2019 | Tajalli et al. |
| 2020/0321778 A1 | 10/2020 | Gharibdoust et al. |
| 2021/0248103 A1 | 8/2021 | Khashaba et al. |

FOREIGN PATENT DOCUMENTS

| | | |
|---|---|---|
| WO | 2018052657 A1 | 3/2018 |
| WO | 2019241081 A1 | 12/2019 |

OTHER PUBLICATIONS

Razavi, Behzad, "The Cross-Coupled Pair—Part III", IEEE Solid-State Circuits Magazine, vol. 7, No. 1, Jan. 2015, 10-13 (4 pages).

Ryckaert, Julien, et al., "A 2.4 GHz Low-Power Sixth-Order RF Bandpass Converter in CMOS", IEEE Journal of Solid-State Circuits, vol. 44, No. 11, Nov. 2009, 2873-2880 (8 pages).

Anadigm, "Using the Anadigm Multiplier CAM", Design Brief 208, www.anadigm.com, Copyright 2002, 2002, (6 pages).

Bae, Joonsung, et al., "Circuits and Systems for Wireless Body Area Network", Electromagnetics of Body-Area Networks: Antennas, Propagation, and RF Systems, First Edition, 2016, 375-403 (29 pages).

Dickson, Timothy, et al., "A 1.8 pJ/bit 16x16 Gb/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

Kim, Kyu-Young, et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Palmisano, G., et al., "A Replica Biasing for Constant-Gain CMOS Open-Loop Amplifiers", Circuits and Systems, IEEE International Symposium in Monterey, CA, May 31, 1998, 363-366 (4 pages).

Schneider, J., et al., "ELEC301 Project: Building an Analog Computer", http://www.clear.rice.edu/elec301/Projects99/anlgcomp/, Dec. 19, 1999, (9 pages).

Shekhar, S., et al., "Design Considerations for Low-Power Receiver Front-End in High-Speed Data Links", Proceedings of the IEEE 2013 Custom Integrated Circuits Conference, Sep. 22, 2013, 1-8 (8 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Tierney, J., "A Digital Frequency Synthesizer", Audio and Electroacoustics, IEEE Transactions, pp. 48-57, vol. 19, No. 1, Abstract, Mar. 1971, (1 page).

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

Terzopoulos, Nikolaos, et al., "A 5-Gbps USB3.0 Transmitter and Receiver Liner Equalizer", International Journal of Circuit Theory and Applications, vol. 43, No. 7, Feb. 28, 2014, 900-916 (17 pages).

* cited by examiner

VARIABLE GAIN AMPLIFIER WITH CROSS-COUPLED COMMON MODE REDUCTION

REFERENCES

The following prior applications are herein incorporated by reference in their entirety for all purposes:

U.S. Pat. No. 9,100,232, filed Feb. 2, 2015 as application Ser. No. 14/612,241 and issued Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi].

U.S. Pat. No. 9,577,815, filed Oct. 29, 2015 as U.S. patent application Ser. No. 14/926,958 and issued Feb. 21, 2017, naming Richard Simpson, Andrew Stewart, and Ali Hormati, entitled "Clock Data Alignment System for Vector Signaling Code Communications Link", hereinafter identified as [Simpson].

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods such as described in [Shokrollahi] have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions. It is common for communications receivers to extract a receive clock signal from the received data stream. Some communications protocols facilitate such Clock Data Recovery or CDR operation by constraining the communications signaling so as to distinguish between clock-related and data-related signal components. Similarly, some communications receivers process the received signals beyond the minimum necessary to detect data, so as to provide the additional information to facilitate clock recovery. As one example, a so-called double-baud-rate receive sampler may measure received signal levels at twice the expected data reception rate, to allow independent detection of the received signal level corresponding to the data component, and the chronologically offset received signal transition related to the signal clock component.

Real-world communications channels are imperfect, degrading transmitted signals in both amplitude (e.g. attenuation) and timing (e.g. delay and pulse smearing) which may be addressed via transmitter pre-compensation and/or receive equalization. Continuous time linear equalization (CTLE) is one known approach to frequency domain equalization, in one example providing compensation for increased channel attenuation at high frequencies. Variable gain amplifiers (VGAs) may be used to amplify the equalized signals generated at the output of the CTLE. Time-domain-oriented equalization methods are also used to compensate for the effects of inter-symbol-interference or ISI on the received signal. Such ISI is caused by the residual electrical effects of a previously transmitted signal persisting in the communications transmission medium, so as to affect the amplitude or timing of the current symbol interval. As one example, a transmission line medium having one or more impedance anomalies may introduce signal reflections. Thus, a transmitted signal will propagate over the medium and be partially reflected by one or more such anomalies, with such reflections appearing at the receiver at a later time in superposition with signals propagating directly.

One method of data-dependent receive equalization is Decision Feedback Equalization or DFE. Here, the time-domain oriented equalization is performed by maintaining a history of previously-received data values at the receiver, which are processed by a transmission line model to predict the expected influence that each of the historical data values would have on the present receive signal. Such a transmission line model may be precalculated, derived by measurement, or generated heuristically, and may encompass the effects of one or more than one previous data interval. The predicted influence of these one or more previous data intervals is collectively called the DFE compensation. At low to moderate data rates, the DFE compensation may be calculated in time to be applied before the next data sample is detected, as example by being explicitly subtracted from the received data signal prior to receive sampling, or implicitly subtracted by modifying the reference level to which the received data signal is compared in the receive data sampler or comparator. However, at higher data rates the detection of previous data bits and computation of the DFE compensation may not be complete in time for the next data sample, requiring use of so-called "unrolled" DFE computations performed on speculative or potential data values rather than known previous data values. As one example, an unrolled DFE stage may predict two different compensation values depending on whether the determining data bit will resolve to a one or a zero, with the receive detector performing sampling or slicing operations based on each of those predictions, the multiple results being maintained until the DFE decision is resolved.

BRIEF DESCRIPTION

Methods and systems are described for receiving a differential input voltage signal at an input of a variable gain amplifier (VGA), and responsively generating an amplified differential output voltage signal on a pair of output nodes by driving a pair of load impedances connected to the pair of output nodes with an amplifier current according to the differential input voltage signal, enabling a cross-coupled differential pair connected in parallel to the pair of load impedances, the cross-coupled differential pair having drain inputs and cross-coupled gate inputs connected to the pair of output nodes to supplement a gain of the amplified differential voltage output voltage signal, and reducing a common mode voltage of the amplified differential output voltage signal by lowering the amplifier current driving the pair of load impedances via a bias control signal, the amplifier current lowered responsive to detecting the supplemented gain of the amplified differential output voltage signal.

DETAILED DESCRIPTION

In recent years, the signaling rate of high speed communications systems have reached speeds of tens of gigabits per second, with individual data unit intervals measured in picoseconds. One example of such a system is given by [Shokrollahi].

Conventional practice for a high-speed integrated circuit receiver have each data line to terminate (after any relevant front end processing such as amplification and frequency equalization) in a sampling device. This sampling device performs a measurement constrained in both time and amplitude dimensions; in one example embodiment, it may be composed of a sample-and-hold circuit that constrains the time interval being measured, followed by a threshold detector or digital comparator that determines whether the signal within that interval falls above or below (or in some embodiments, within bounds set by) a reference value. Alternatively, a digital comparator may determine the signal amplitude followed by a clocked digital flip-flop capturing the result at a selected time. In other embodiments, a combined time- and amplitude-sampling circuit is used, sampling the amplitude state of its input in response to a clock transition.

Subsequently, this document will use the term sampling device, or more simply "sampler" to describe this receiver component that generates the input measurement, as it implies both the time and amplitude measurement constraints, rather than the equivalent but less descriptive term "slicer" also used in the art. The well-known receiver "eye plot" graphically illustrates input signal values that will or will not provide accurate and reliable detected results from such measurement, and thus the allowable boundaries of the time- and amplitude-measurement windows imposed on the sampler.

Receive Signal Equalization

At high data rates, even relatively short and high-quality communications channels exhibit considerable frequency-dependent signal loss, thus it is common for data receivers to incorporate receive signal equalization. Continuous-time Linear Equalization (CTLE) is commonly used to provide increased high frequency gain in the receive signal path, in compensation for the increased high frequency attenuation of the channel. Signal path attenuation may also require additional signal amplification at the receiver to provide sufficient signal amplitude for detection. Such embodiments will typically include a Variable Gain Amplifier or VGA in the receive signal path.

Example Embodiment

Figure 1:
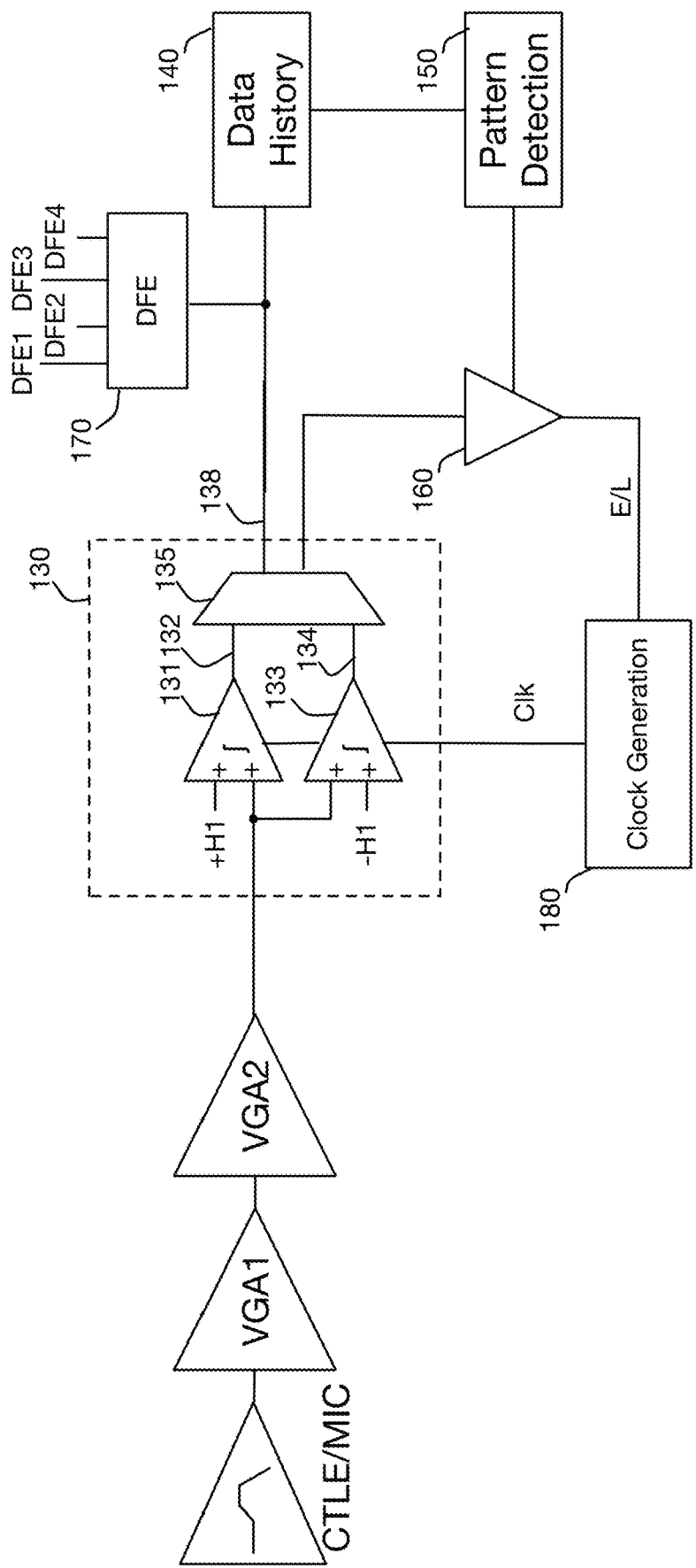
FIG. 1 is a block diagram of a receiver, in accordance with some embodiments.

For purposes of description and without implying limitation, a serial data receiver as shown in FIG. 1 will be used as an example. This example receiver includes at least one stage 130 of speculative DFE supported by two data samplers 131 and 133 performing concurrent time-sampling operations at two different amplitude thresholds +H1 and −H1, and a receiver clock system 180 to produce a sampling clock Clk, the phase of which may be adjusted by a CDR correction to optimize data sampling timing. As shown, the data samplers include comparators 131 and 133 generating comparator outputs 132 and 134, respectively, by slicing the signal received from the signal processing path composed of CTLE/MIC 110, VGA1, and VGA2, and sampling the comparator output according to the sampling clock. In some embodiments, VGA1 is adjusted during a startup calibration process, while VGA2 is dynamically adjusted during a mission mode of operation.

In some embodiments, an apparatus includes two comparators 120 configured to generate two comparator outputs, the two comparators configured to compare a received signal to a first threshold and a second threshold according to a sampling clock, the first and second thresholds determined by an estimated amount of inter-symbol interference on a multi-wire bus. The apparatus may further include a data decision selection circuit 135 configured to select one of the two comparator outputs as a data decision, the selection based on at least one prior data decision that may be stored in data value history 140. The apparatus further includes a phase-error decision selection circuit 160 configured to provide the other of the two comparator outputs as a phase-error decision in response to receiving a CDR selection signal from a pattern detection circuit 150 configured to identify a predetermined data decision pattern in the data value history storage 140.

In some embodiments, the apparatus further includes a receiver clock system 180 configured to receive the phase-error decision and to responsively adjust a phase of the sampling clock Clk. In some embodiments, the phase-error decision is an early/late logic decision on a transition of the received signal. In some embodiments, the data decision selection circuit 135 and phase-error decision circuit 160 select different comparator outputs.

In some embodiments, the apparatus further includes a decision-feedback equalization (DFE) circuit 170 configured to generate the first and second thresholds.

In some embodiments, the apparatus further includes a sub-channel detection multi-input comparator (MIC) operating on signals received via a plurality of wires, the sub-channel detection MIC configured to generate the received data input signal. In such embodiments, the signals received via the plurality of wires correspond to symbols of a codeword of a vector signaling code, the codeword corresponding to a weighted summation of a plurality of sub-channel vectors, each sub-channel vector mutually orthogonal. In such an embodiment, the inter-symbol interference is sub-channel specific, the sub-channel specific ISI corresponding to modulation of components of a corresponding sub-channel vector associated with the received signal. In some embodiments, sub-channel specific ISI associated with each sub-channel vector is mutually orthogonal. In some embodiments, the apparatus may further include a filter configured to filter the received signal prior to generating the comparator outputs.

Figure 2:
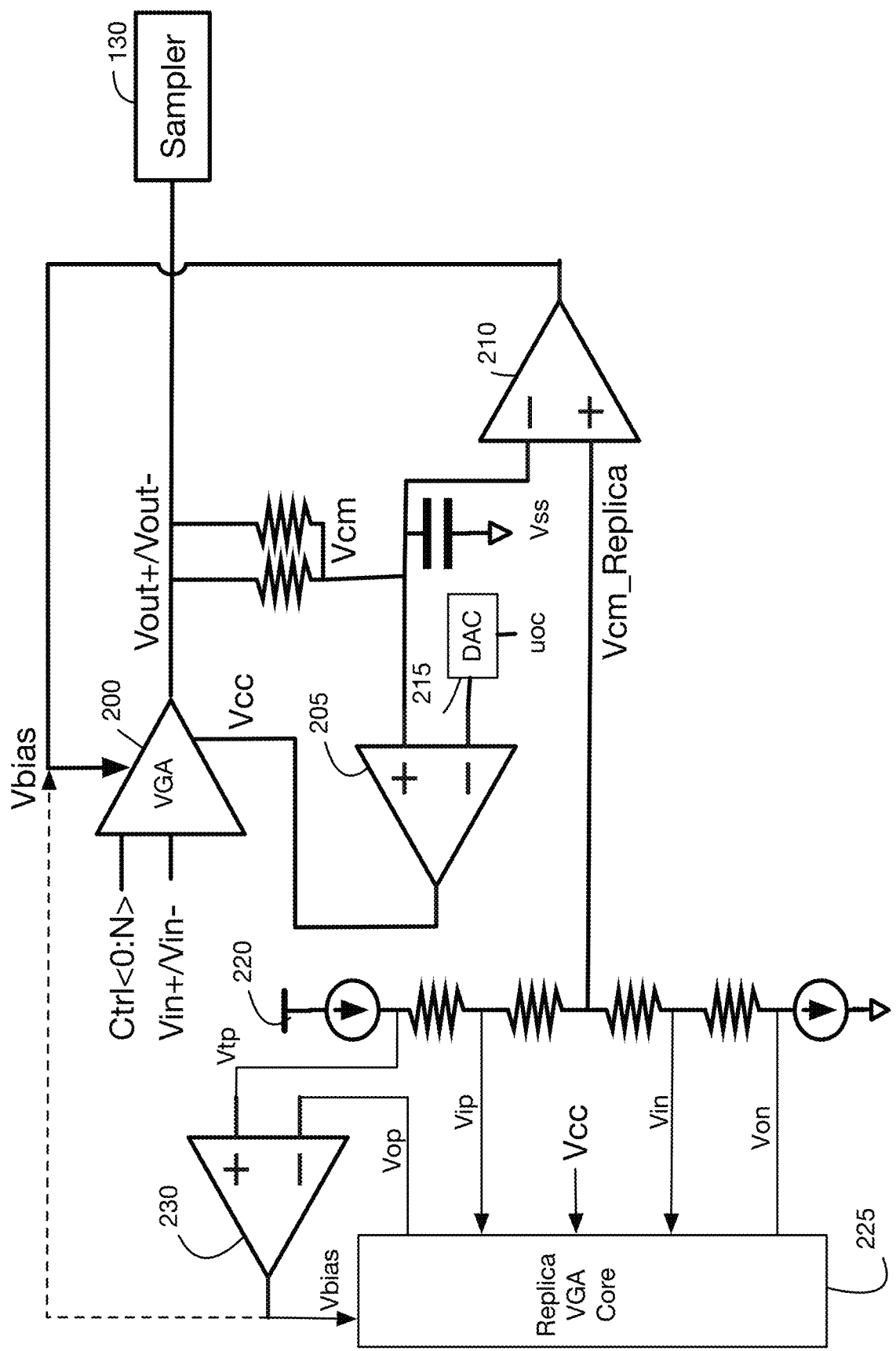
FIG. 2 is a block diagram of a receiver system using a variable gain amplifier that includes two control loops.

FIG. 2 is block diagram of a receiver system incorporating a VGA 200. Furthermore, FIG. 2 includes sampler 130, a cross-coupling voltage control signal generator 205, a bias control signal generator 210, a digital to analog converter (DAC) 215, a voltage generator 220, a replica VGA core 225, and a replica bias control signal generator 230. As shown in FIG. 2, control signal generators 205, 210, and 230 are depicted as having operational amplifier (op-amp) structures, however such structures should not be considered limiting. FIG. 2 is shown as only having one VGA stage, however it should be noted that in some embodiments such as that of FIG. 1, there may be additional VGA stages depending on the amount of amplification needed. As shown in FIG. 2, cross-coupling voltage control signal generator 205 is configured to compare the common mode voltage Vcm of the output signal Vout+/Vout− to a common mode voltage uoc that may be obtained from e.g., RTL logic in an external digital loop, and converted to an analog voltage using DAC 215. It should be noted that the cross-coupling voltage control signal generator 205 encompasses the common-mode voltage measurement circuit composed of the parallel resistors. The output of cross-coupling voltage control signal generator 205 is a cross-coupling voltage control signal Vcc configured to bias a cross-coupled differential pair device connected in parallel to the load resistances RL in VGA 200 for lowering the Vcm, described in more detail below. FIG. 2 further includes a replica VGA core 225 connected to voltage generator 220, shown in FIG. 2 as a floating resistor ladder. The voltage generator 220 is configured to define a target voltage difference, and is defined according to Von, the lower voltage on one of the output terminals of the VGA core replica 225. Furthermore, voltage generator 220 also provides a reference voltage Vin/Vip to the replica VGA core 225. Replica bias control signal generator 230 compares the higher voltage Vop of the differential output voltage of the replica VGA core 225 to the target voltage Vtp and adjusts the bias of the replica VGA core 225 until Vop and Vtp match. In some embodiments, the same bias control signal generated for the replica VGA core 225 may be provided to VGA 200, as indicated by the dotted line. In an alternative embodiment, a bias control signal generator 210 may take the form of a mirroring op-amp to generate the bias control signal Vbias for VGA core 220, which realizes a more precise way to mirror the bias current to VGA 200 by comparing the common mode Vcm_replica of the replica circuit pulled from the resistor ladder to the common mode voltage Vcm of the VGA 200. Based on the comparison, op amp 210 may update the bias control signal Vbias provided to the VGA 200, which may control the amount of bias current used in VGA 200. In some embodiments, uoc may be obtained from a comparison of VCM to the common mode of the DFE circuit 170 of FIG. 1 in order to define a target common mode for the analog loop using cross-coupling voltage control signal generator 205. In such embodiments, the Vcm of VGA 200 is compared to the common mode of the DFE circuit by an auto-zero-comparator, and the digital value uoc is adjusted based on the result. It should be further noted that some embodiments may not utilize a replica VGA core (or potentially a much smaller replica VGA core in terms of power and area) and may rather calibrate the VGA 200 by providing a constant differential input voltage to VGA 200 and analyzing the constant differential output voltage with respect to a target voltage. Such embodiments may incorporate multiplexing functionality to switch the inputs of the VGA 200 between the data path and the constant calibration voltage and may include an additional comparator to compare the constant differential output voltage to the target voltage. Such an embodiment alleviates any matching error between VGA 200 and the replica VGA 225. It should be noted that in such an embodiment a replica VGA core may still be included to perform dynamic calibration according to e.g., temperature variation. As matching error is no longer a concern, the replica VGA core may be smaller in terms of power and area.

Figure 3:
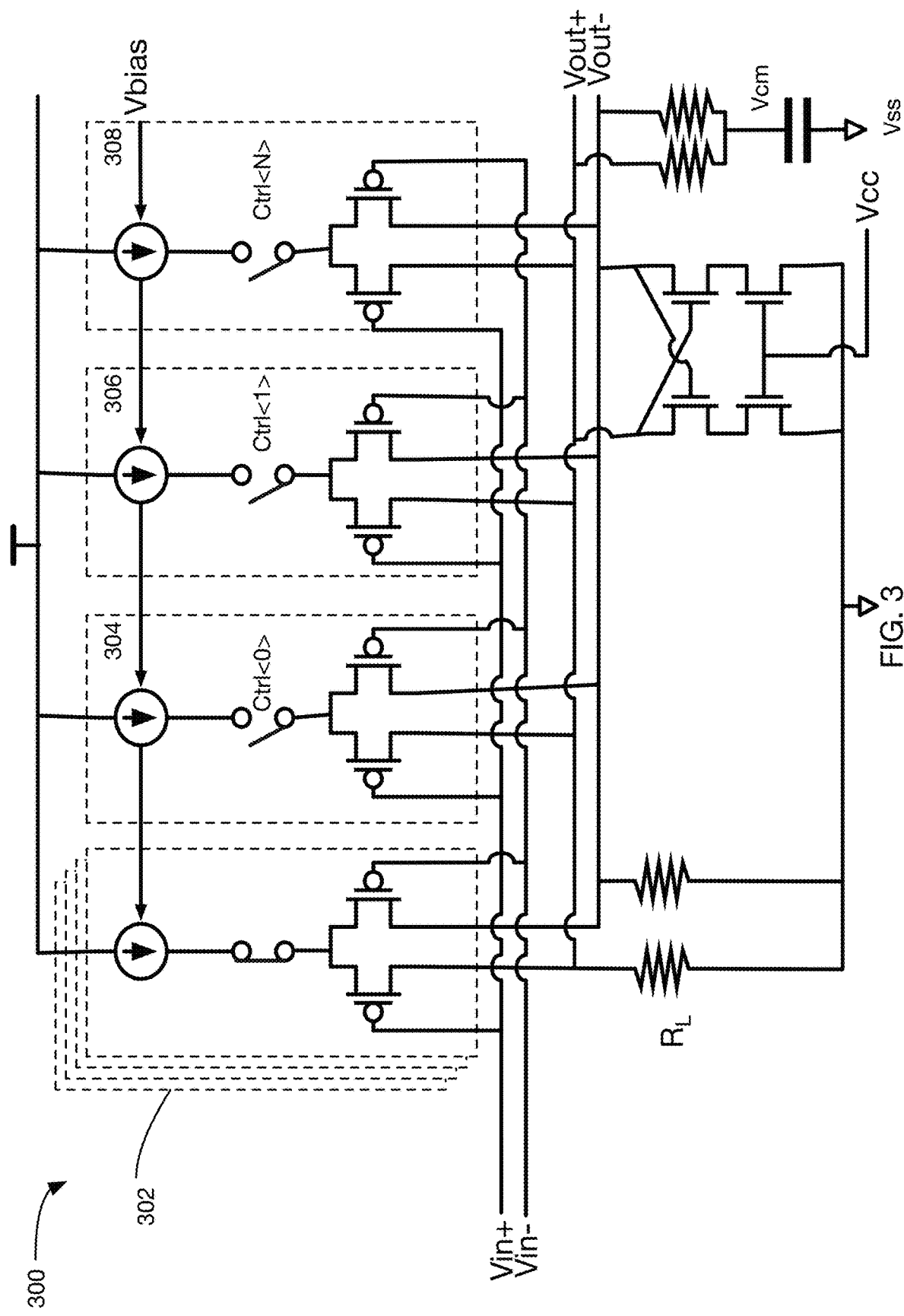
FIGS. 3 and 4 are schematics of a variable gain amplifier utilizing a cross-coupled differential transistor pair, in accordance with some embodiments.

FIG. 3 is a schematic of a VGA 300, in accordance with some embodiments, which may be used as VGA 200 in FIG. 2. As shown, the VGA 300 includes a primary amplifier stage 302, which may include a plurality of current sources and differential pairs of PMOS transistors connected in parallel. It should be noted that the "primary" amplifier stage is the stage of the VGA that is "always on", that is, the differential pairs of PMOS transistors are always conducting the current generated by the current sources through the load impedances $R_L$. Furthermore, VGA 300 includes N supplementary amplifier stages 304/306/308. As shown, each supplementary stage includes a gain control switch configured to receive a corresponding bit of the gain control signal Ctrl<0> ... Ctrl<N>. The primary amplifier stages 302 may include similar switches for circuit symmetry, however such switches may be forced on at all times. In a differential amplifier, the amount of gain applied to the input signal is as follows:

$$\text{gain} = gm \times R_L \tag{Eqn. 1}$$

where gm is the transconductance of the MOSFET devices, and $R_L$ is the load impedance. More specifically, the transconductance is proportional to the square root of both the width parameter of the MOSFET devices as well as the amount of drain current $I_D$. More specifically:

$$gm \propto \sqrt{\left(\frac{W}{L}\right) * I_D} \tag{Eqn. 2}$$

Figure 4:
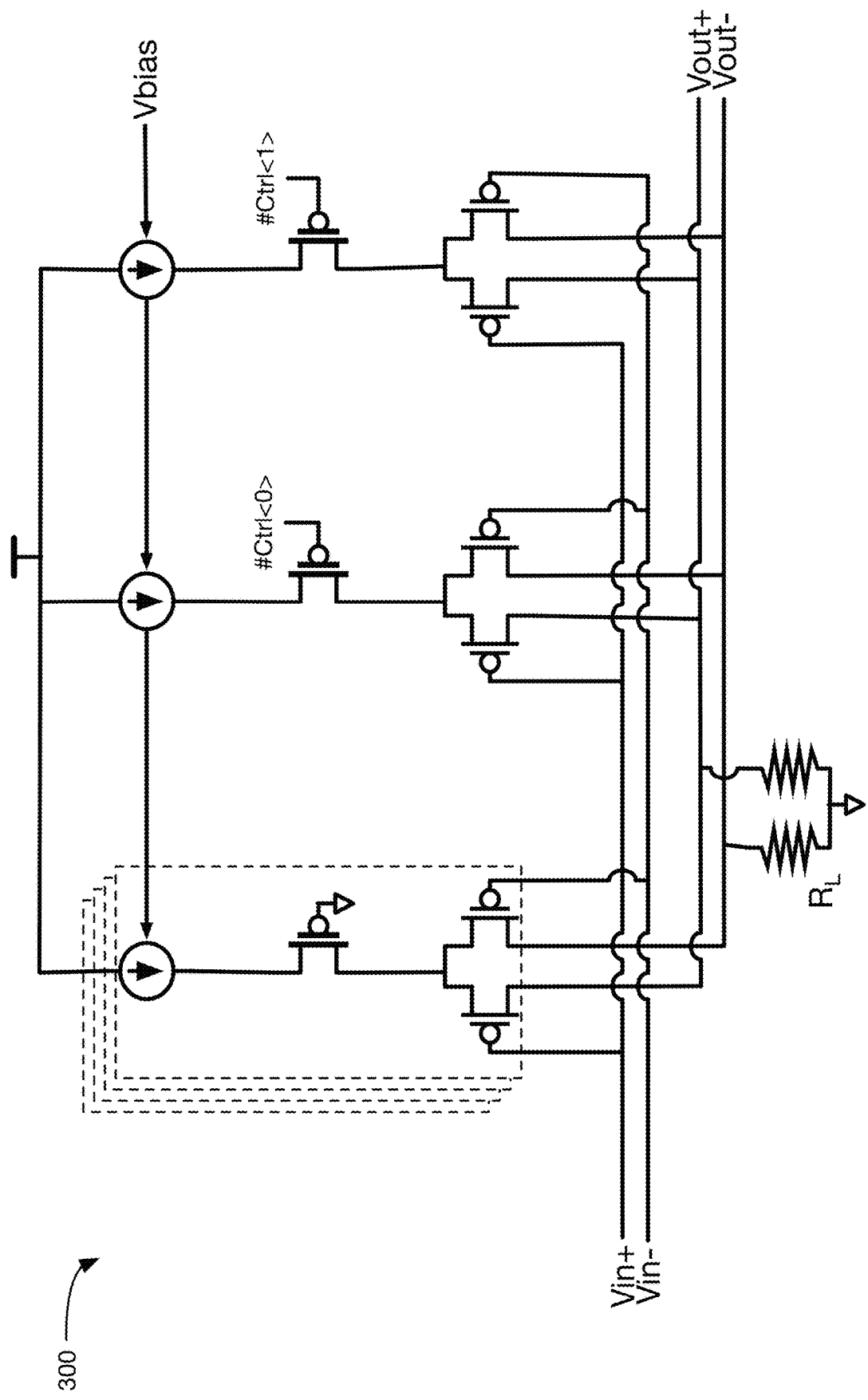

Thus, in the VGA 300 of FIG. 3, enabling additional gain control switches (i) increases the overall effective width parameter of the VGA, as well as (ii) adds an additional amount of current per the corresponding current source connected to the gain control switch. In FIG. 4, the gain control switches of FIG. 3 are illustrated as being composed of PMOS switching devices. Each gain control switch selectively enables one of the supplementary amplifier stages to control the amount of amplification applied to the differential input signal Vin+/Vin−.

The VGA of FIG. 3 also includes a cross-coupled NMOS differential pair having cross-coupled input connected to the pair of output nodes. Furthermore, two additional NMOS transistors are connected to the cross-coupled NMOS differential pair and configured to receive a cross-coupling voltage control signal Vcc, as generated by op amp 205 in FIG. 2. In some embodiments, the cross-coupled NMOS differential pair is selectively enabled to reduce the common mode voltage Vcm, by simulating a negative resistance to increase the amplification of the differential input signal at the differential pair of output nodes. Additional detail is given below. It should be noted that while the circuits shown and described herein are in relation to PMOS configurations, the entire structures described herein may also be realized in complementary form, e.g., if VDD and VSS are interchanged and the PMOS devices are replaced by NMOS devices.

VGA with Improved Linearity

Figure 5:
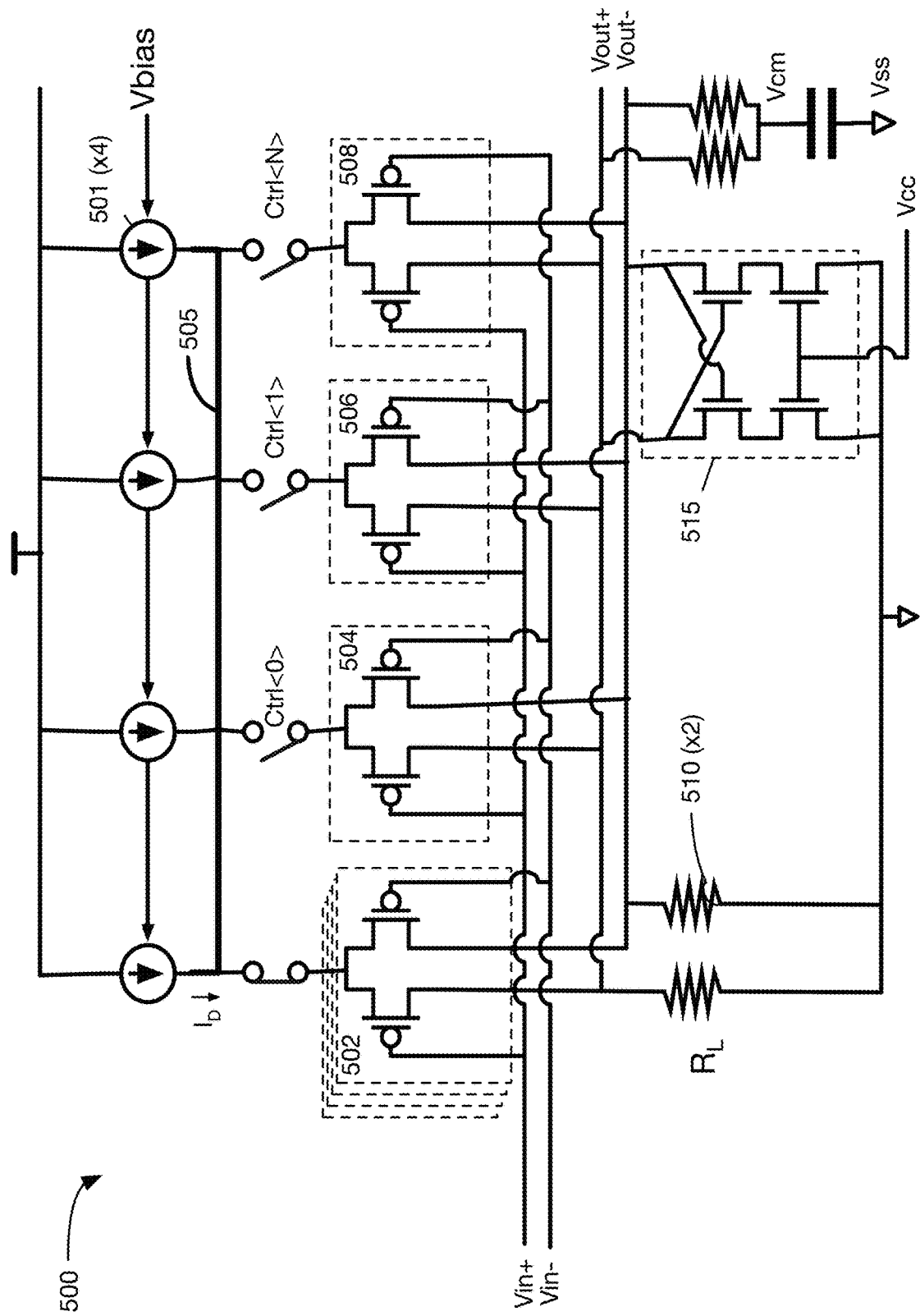
FIGS. 5 and 6 are schematics of a variable gain amplifier that has improved linearity characteristics at low gain settings, in accordance with some embodiments.
Figure 7:
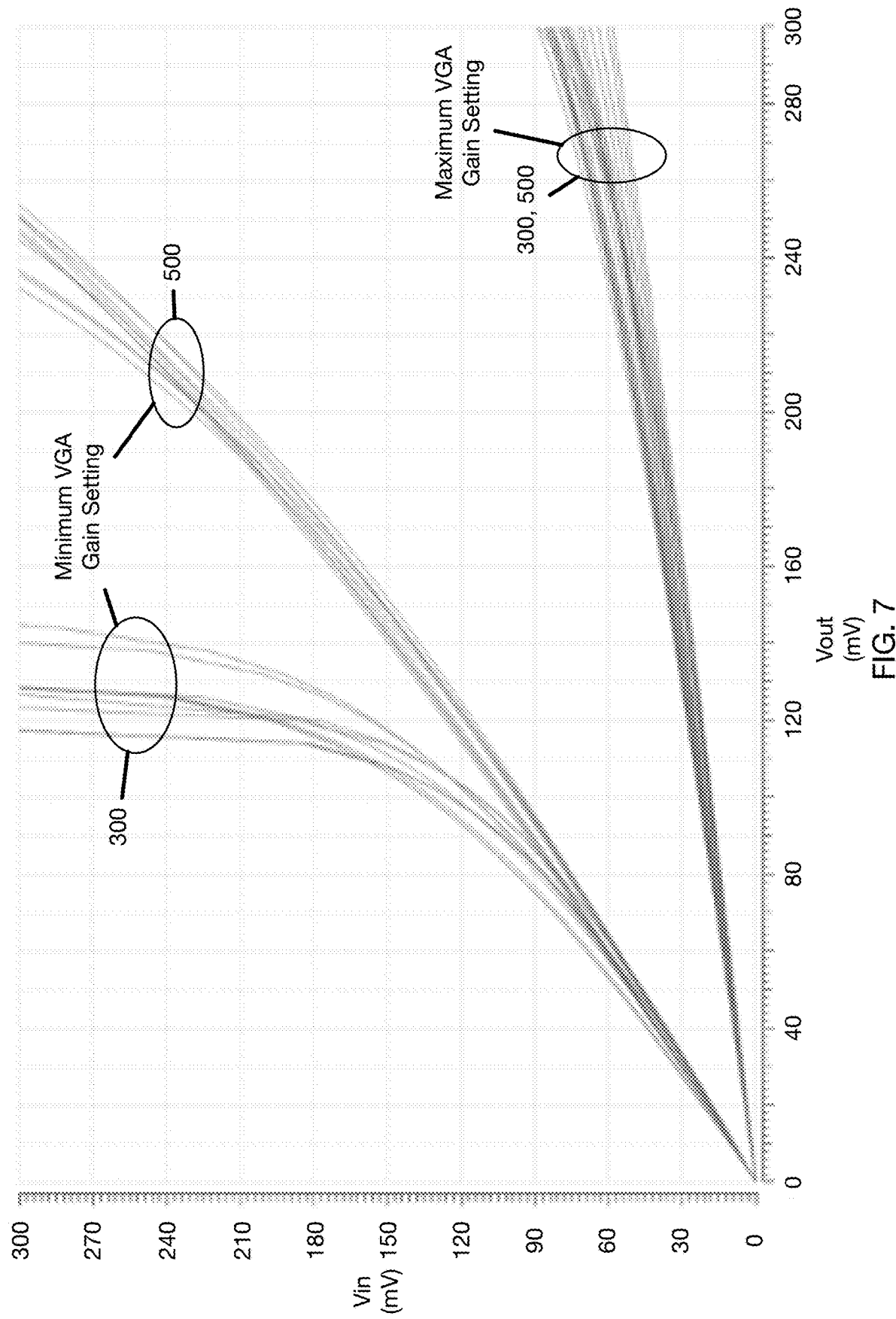
FIG. 7 is a plot illustrating the linearity of the variable gain amplifier of FIGS. 3 and 4 compared to the linearity of the variable gain amplifier of FIGS. 5 and 6.

In some scenarios, the VGA of FIG. 3 may suffer from non-linearity at lower gain settings. FIG. 7 includes a waveform illustrating the non-linearity of the VGA 300 of FIG. 3 over process, voltage and temperature variation (PVT) corners at the minimum gain setting in which all of the supplemental amplifier stages are disabled, i.e., shut off. As shown in FIG. 7, after the differential input voltage Vin reaches about 120 mV the differential output voltage Vout begins to exponentially increase. FIG. 5 illustrates a VGA 500 that takes advantage of source degeneration in the PMOS differential amplifiers. As shown in FIG. 5, the VGA 500 includes a current source 501 configured to receive a bias control signal Vbias and to generate a fixed current. In FIG. 5, the current source comprises a plurality of current sources connected in parallel, the outputs of which are shorted via e.g., a metal "bar" 505. In an alternative embodiment, the VGA 500 of FIG. 5 may include a single current source. Furthermore, a "fixed current" in this context relates to a given amount of current for a given bias control signal value. On the contrary, the VGA 300 of FIG. 3 generates a variable amount of current through the load resistances depending on how many of the parallel current sources are connected in parallel. Embodiments described below assume a fixed amount of current driven through the load resistances for a given bias control signal value. While the amount of current may be configurable via the bias control signal, it should be noted that the bias control signal value adjusts the current based on e.g., common mode characteristics, and that "fixed" in this context means not adding additional current by switching in additional supplemental amplifier stages.

The VGA 500 further includes a plurality of differential amplifier stages connected to the current source. Similar to above, the plurality of differential amplifier stages includes a primary amplifier stage 502 and a set of supplemental amplifier stages 504/506/508, each of the plurality of differential amplifier stages having a pair of differential input nodes configured to receive a differential voltage input signal and a pair of output nodes connected to common load impedances, and configured to generate an amplified differential voltage output signal on the pair of output nodes by directing the fixed current through the load impedances. The VGA 500 further includes a set of gain control switches connected to the primary amplifier stage and the plurality of supplemental amplifier stages configured to adjust an overall transconductance of the plurality of differential amplifier stages by selectively connecting each supplemental amplifier stage in parallel to the primary amplifier stage via a corresponding gain control switch.

In such a configuration, the transconductance (and therefore gain) of the amplifier is configured only via the transistor width parameter, while the drain current $I_D$ of the above equation is fixed according to the bias voltage. By driving the transistors of the primary amplifier stage with the maximum available current at the minimum gain setting (thus a very high current density through each differential amplifier in the primary amplifier stage), the source resistance begins to degenerate the primary differential amplifier stage, thus reducing the amount of amplification at the low-gain settings. As the VGA is configured with an increasingly larger number of enabled supplemental amplifier stages, the current density through each differential pair is reduced, and the amount of gain degeneration is decreased. Thus, at the maximum gain setting, the VGA 300 of FIG. 3 and the VGA 500 of FIG. 5 have nearly the same behavior.

Figure 6:
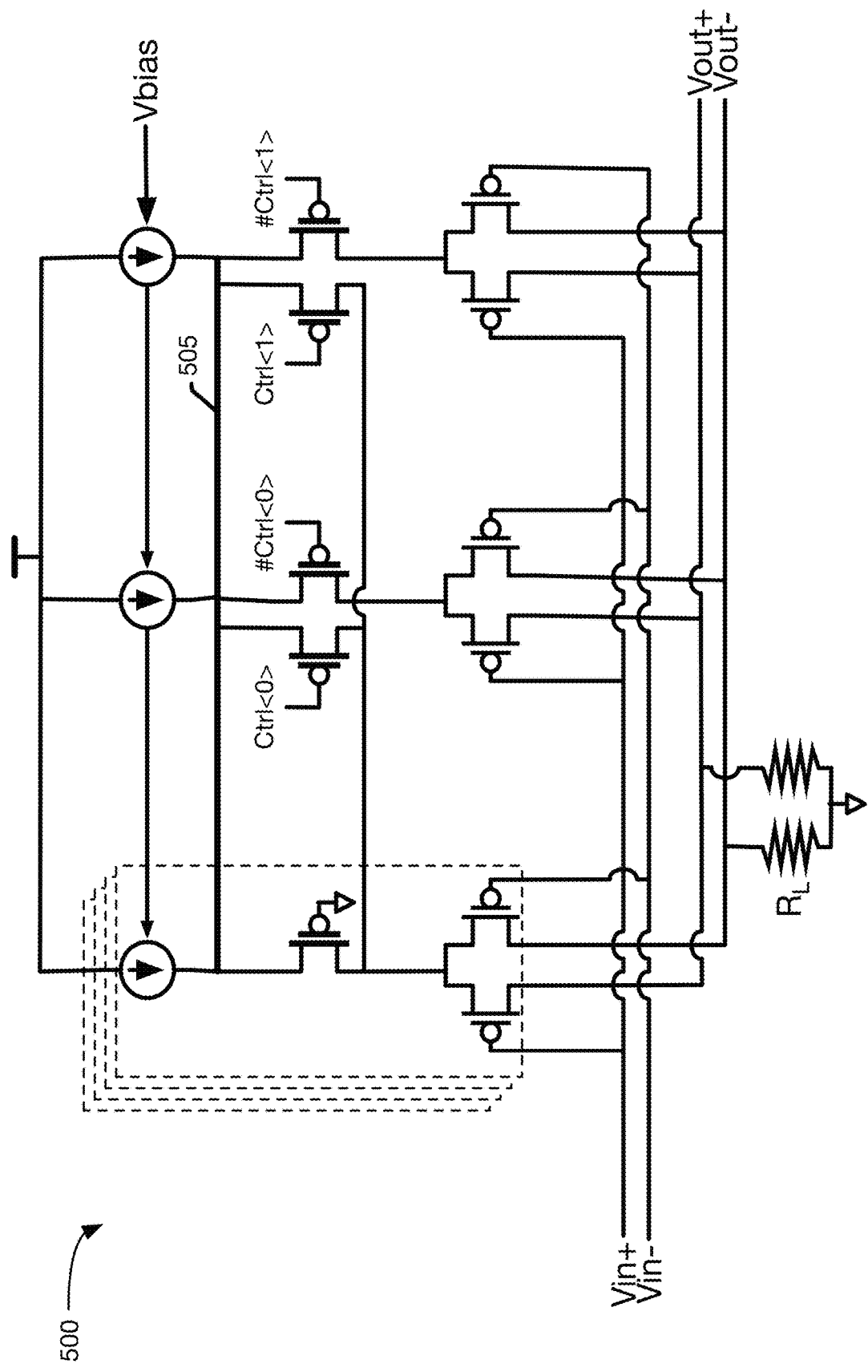

FIG. 6 is another schematic of the VGA 500 illustrating the use of PMOS devices to act as the gain control switches. As shown, the supplemental amplifier stages have gain control switches composed of two PMOS devices; one connecting the supplemental amplifier stage in parallel to the primary amplifier stage, and one creating a shorted connection to the primary amplifier stage, thereby disconnecting the supplemental amplifier stage from the primary amplifier stage. The primary amplifier stage is shown as including a PMOS device as well, however such a device may be included for circuit symmetry and consistent circuit behavior over all of the amplifier stages. In the embodiment of FIG. 6, the current sources may include a bias transistor connected in series to a cascode transistor receiving a bias voltage Vbias and a cascode voltage Vcasc, respectively. In such an embodiment, the gain control switches are a set of PMOS devices configured to receive Ctrl< > and Ctrl #< > signals corresponding to VDD and VSS values respectively. However, it may be the case that the gain control switches correspond to switched cascodes in the current source to alleviate the voltage drop of the additional switch. In such an embodiment, the current sources in FIG. 6 may be composed of only the bias transistor, while the gain control switches are two parallel-connected cascode transistors connected in series to the bias transistor. In such a configuration, the gain control signals Ctrl< > and Ctrl #< > may have values of VDD and Vcasc (as opposed to VSS).

Referring to FIG. 7, the VGA 500 as described in FIGS. 5 and 6 has increased linearity as compared to the previously described VGA 300 at lower gain settings. Specifically, the linearity is proportional to the transconductance as follows:

$$\text{Linearity} \propto \frac{1}{gm/I_D} \qquad \text{(Eqn. 3)}$$

Thus, in the minimum gain scenario in which all supplemental amplifier stages are disconnected and thus all the current is driving through the primary amplifier stage, the increased drain current $I_D$ through the primary amplifier stage in VGA 500 as compared to VGA 300 improves the linearity of VGA 500 at low gain settings. FIG. 7 further illustrates that at the maximum gain setting, the linearity of VGA 500 and VGA 300 is approximately the same.

Figure 8:
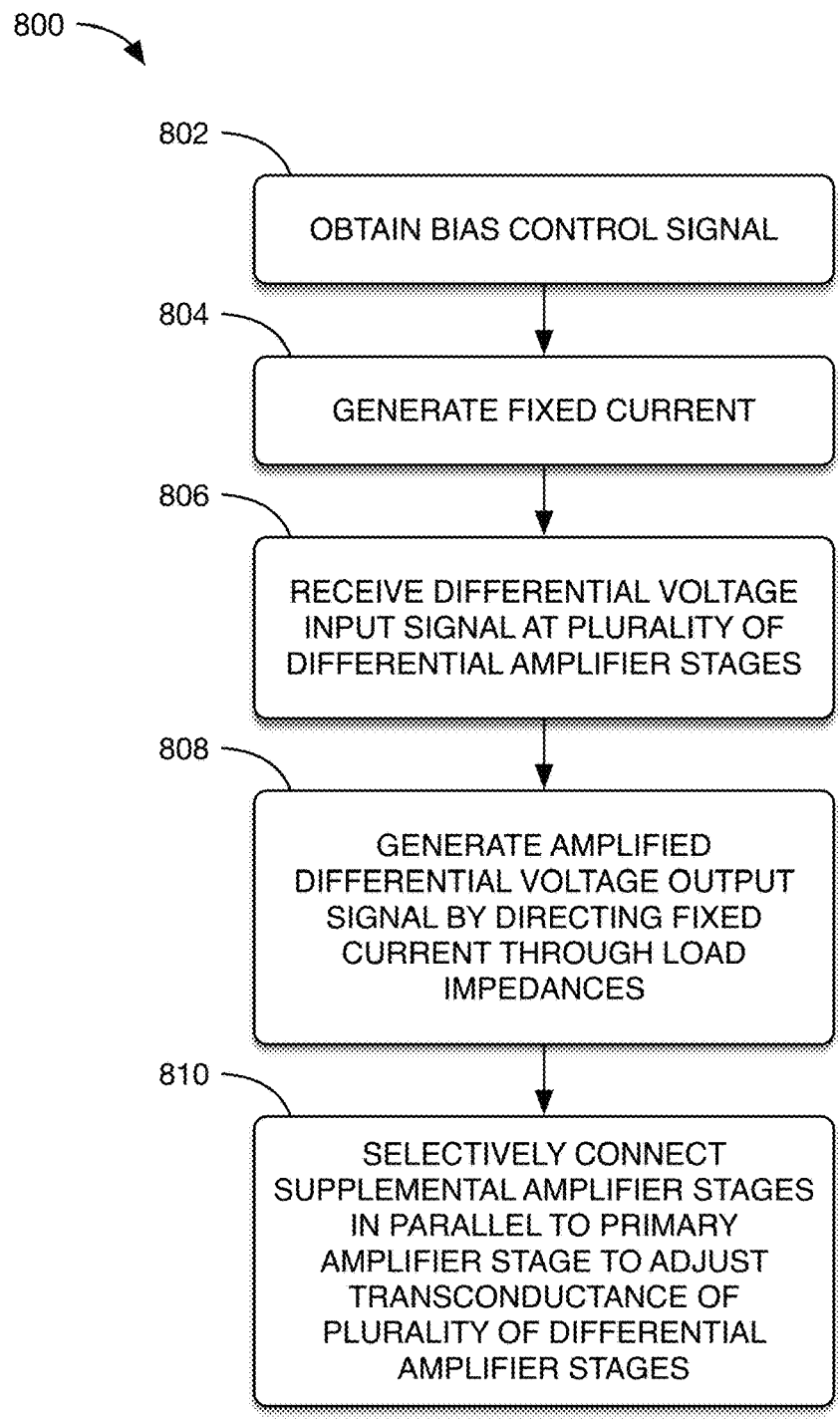
FIG. 8 a flowchart of a method 800, in accordance with some embodiments.

FIG. 8 is a flowchart of a method 800, in accordance with some embodiments. As shown, method 800 includes obtaining 802 a bias control signal Vbias at a current source 501 and responsively generating 804 a fixed current. In some embodiments, the current source comprises a plurality of current sources connected in parallel. In such embodiments, each current may have equal or different relative magnitudes. In some embodiments, the outputs of the plurality of current sources are shorted together using e.g., a conductive metal bar. In some embodiments, the current source may be a single current source. In some embodiments, the bias control signal is obtained via a replica VGA core, the replica VGA core comparing an output voltage swing to a target output voltage swing.

The method 800 further includes receiving 806 a differential voltage input signal Vin± at corresponding differential input nodes of a plurality of differential amplifier stages connected to the current source, the plurality of differential amplifier stages comprising a primary amplifier stage 502 and a set of supplemental amplifier stages 504/506/508, each of the plurality of differential amplifier stages having a pair of output nodes connected to common load impedances $R_L$ 510; The method 800 further includes generating 808 an amplified differential voltage output signal on the pair of output nodes by directing, via the plurality of differential amplifier stages, the fixed current through the load impedances 510. In some embodiments, the bias control signal Vbias is obtained via a comparison of the common mode voltage Vcm_replica of the output voltage of the replica VGA core to the common mode voltage Vcm of the differential output signal by an operational amplifier 210, as shown in FIG. 2.

The method 800 further includes selectively connecting 810 each supplemental amplifier stage in parallel to the primary amplifier stage via a corresponding gain control switch of a set of gain control switches connected to the primary amplifier stage and the plurality of supplemental amplifier stages to adjust an overall transconductance of the plurality of differential amplifier stages. In some embodiments, the gain control switches may utilize switched cascodes connected in parallel in the current source to switch the current between the primary amplifier stage and a corresponding supplemental amplifier stage.

In some embodiments, the primary amplifier stage has a fixed transistor width parameter "W" as described above in relation to Eqn. 2. In such embodiments, the fixed transistor width parameter is based on the width parameter of a single transistor that may be larger than the individual width parameters of each individual supplemental stage. In alternative embodiments, the width parameter of the primary amplifier stage is defined by a plurality of differential amplifier stages connected in parallel, where each differential amplifier stage is the same size as each individual supplemental amplifier stage.

In some embodiments, the gain control signal comprises a plurality of bits, wherein each bit of the plurality of bits of the gain control signal is provided to a respective gain control switch. As successively more supplemental amplifier stages are connected in parallel, it may be the case that the amount of gain added per stage begins to decrease, thus producing a non-linear gain curve for each gain control step. This may especially be the case when each supplemental amplifier stage has an equal transistor width dimension, which may be beneficial for some implementations to maintain circuit symmetry throughout the VGA. Thus, one embodiment may enable an increasingly large number of additional supplemental amplifier stages per gain control step resulting in a more linear control of the gain at high-gain settings. In one non-limiting example, Ctrl<0:2> may each enable one additional supplemental amplifier stage, Ctrl<3:5> may each enable two additional supplemental amplifier stages, and Ctrl<6:9> may each enable three additional supplemental amplifier stages, etc. It should be noted, however, that it is also possible to design the width of each supplemental amplifier stage independently to achieve similar results, potentially making the supplemental amplifier stages added during the high-gain settings out of transistors having a larger width than the supplemental amplifier stages added during the lower-gain settings.

Cross-Coupled Common Mode Correction

The common mode voltage Vcm of the differential output voltage signal Vout+/− may begin to increase due to e.g., PVT and/or the selection of larger target amplitudes via the replica VGA core (thus increasing the bias voltage of the current sources of the VGA). Furthermore, in VGAs that add current for each incremental gain stage, Vcm may also increase because of the additional current added via the additional gain steps (as in the VGA shown in FIG. 3). Thus, some embodiments utilize a cross-coupled differential pair of transistors 515 connected in parallel to the load impedances to lower the common mode voltage Vcm for these conditions. As shown in the VGA 500 of FIG. 5, cross-coupled NMOS device 515 are connected to the output nodes in parallel to the load impedances $R_L$. In some embodiments, the cross-coupled NMOS device is selectively enabled to lower the common mode voltage Vcm of the output signal Vout+/Vout− responsive to selection of a large target output voltage Vtp in the replica VGA core (i.e., a large bias setting for the VGA). In such embodiments, the cross-coupled NMOS device may be enabled to provide an increased gain at the output rather than increasing the amount of bias current via Vbias provided to the current sources in the VGA, as described in more detail below. Other embodiments may enable the cross-coupled NMOS device responsive to the gain control signal, as in the case of the VGA shown in FIG. 3. It should be noted that as the VGA of FIG. 5 and described above produces a constant amount of current (for a given bias control signal setting), the common mode voltage remains the same despite adding and removing supplemental amplifier stages. In some embodiments, the cross-coupled device 515 provides positive feedback to increase the amount of gain of the VGA, thereby acting as a negative impedance to the load impedances $R_L$. As shown, the cross-coupled NMOS device 515 includes a differential pair of NMOS devices having inputs cross-coupled to each other's drains, and a differential pair of NMOS devices connected to the sources that is externally biased by cross-coupling voltage Vcc. As shown in FIG. 2, cross-coupling voltage Vcc may be generated responsive to a comparison of the common mode voltage Vcm of the differential output voltage Vout+/Vout− to the voltage produced by DAC 215 responsive to the digital value uoc that represents the target common mode voltage for the analog loop. At higher gain settings, the common mode voltage Vcm increases, which triggers op amp 205 to produce the bias voltage Vcc for the cross-coupled NMOS device.

As shown in FIG. 5, a positive cross-coupling voltage control signal Vcc provided to the current sources will enable the cross-coupled NMOS devices to turn on and begin diverting a portion of the current originally flowing through the load impedances $R_L$ through the cross-coupled NMOS devices. Responsively, Vcm decreases as less overall current is provided to load impedances $R_L$. Furthermore, as described above, the cross-coupled NMOS device offers an additional amount of gain due to the cross-coupled inputs. Specifically, as e.g., Vout+ increases, the NMOS connected to the node Vout– begins to turn on and Vout– is driven lower due to the positive feedback. Referring again to FIG. 2, the increased output gain may also cause the bias control signal Vbias provided to the current source in VGA 200 to decrease the amount of fixed current generated through the plurality of amplifier stages. In FIG. 2, the replica VGA core 225 includes a replica cross-coupled NMOS device, and the cross-coupling control signal Vcc is also provided to the replica cross-coupled NMOS device in the replica VGA core. As described above, the bias control signal Vbias for the replica VGA core 225 is generated by comparing the differential voltage of the replica Vop-Von to a target differential output voltage Vtp-Von. As the cross-coupled NMOS in the replica circuit provides additional gain, the voltage swing of the replica increases relative to the target voltage swing, and thus the replica circuit responds by reducing the amount of fixed current generated through the differential amplifier stages via bias control signal Vbias generated by op amp 230. Reducing the amount of fixed current for the high gain setting reduces the voltage drop over the load impedances $R_L$, thus reducing the common mode voltage Vcm. As described above, a secondary effect of enabling the cross-coupled NMOS device is to divert a portion of the fixed current away from the load impedances $R_L$, further reducing the voltage drop across $R_L$ and thus further reducing Vcm.

In some embodiments, an apparatus includes a differential amplifier (e.g., 502) having a pair of differential input nodes configured to receive a differential voltage input signal and a pair of output nodes connected to a load impedance 510, the differential amplifier configured to generate an amplified differential voltage output signal on the pair of output nodes by directing a current through the load impedance. The apparatus further includes a cross-coupled differential pair 515 connected in parallel to the load impedances 510, the cross-coupled differential pair having cross-coupled gate inputs connected to the pair of output nodes, the cross-coupled differential pair configured to divert a portion of the current away from the load impedances and to increase an amplification of the differential voltage output signal by driving, via the diverted portion of the current, one of the pair of output nodes in an opposite direction of a positive feedback signal from another of the pair of output nodes. The apparatus further includes a bias control circuit having a replica cross-coupled differential pair (e.g, contained in replica VGA core 225), the bias control circuit configured to detect an increased amplification from the replica cross-coupled differential pair, and to responsively adjust a bias control signal Vbias provided to a current source in the differential amplifier to reduce a common mode voltage of the differential voltage output signal by lowering the current through the load impedance. In such embodiments, the bias control signal may be generated using e.g., one of bias control signal generator 210 or the replica bias control signal generator 230 as described above.

Figure 9:
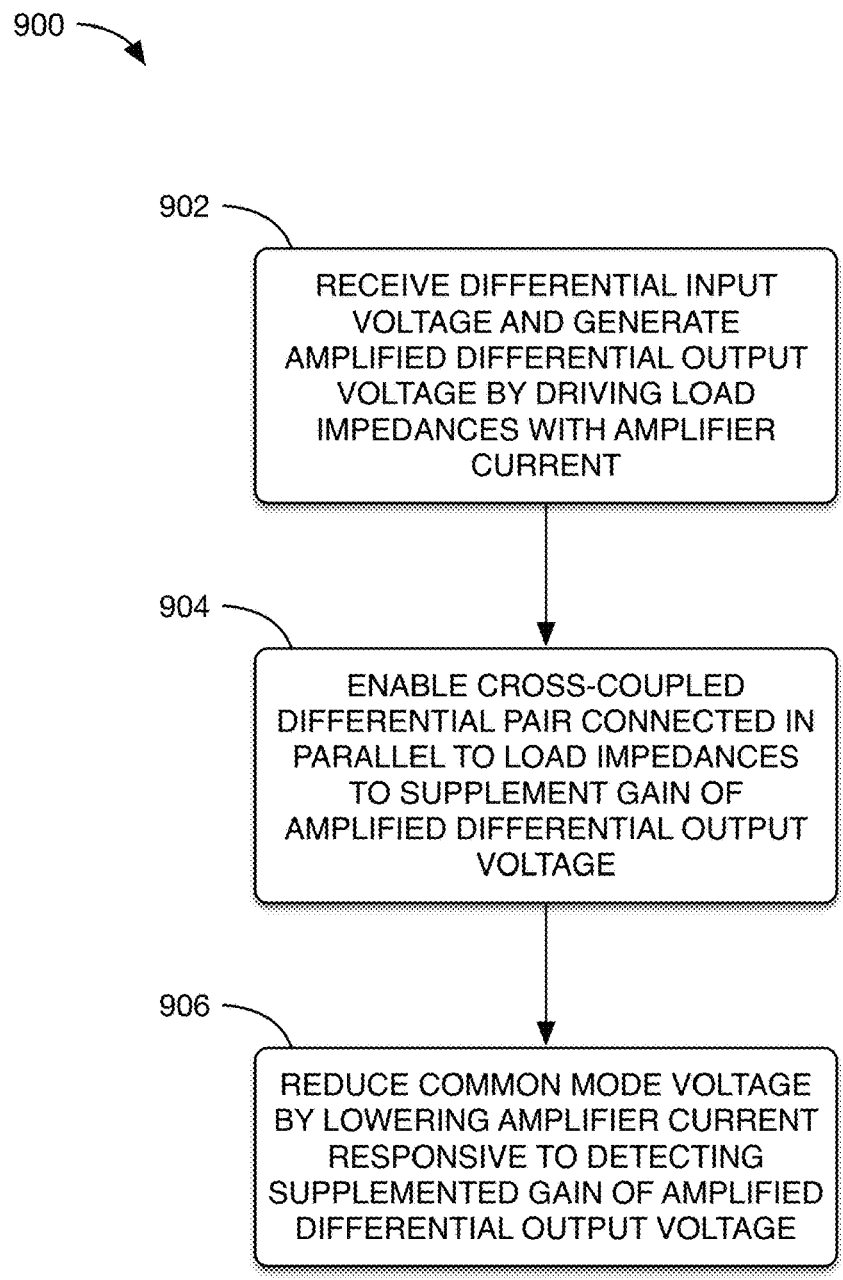
FIG. 9 is a flowchart of a method 900, in accordance with some embodiments.

FIG. 9 is a flowchart of a method 900, in accordance with some embodiments. As shown, method 900 includes receiving 902 a differential input voltage signal Vin+/– at an input of a variable gain amplifier 500, and responsively generating an amplified differential output voltage signal Vout+/– on a pair of output nodes by driving a pair of load impedances 510 connected to the pair of output nodes with an amplifier current according to the differential input voltage signal. The method 900 further includes selectively enabling 904 a cross-coupled differential pair 515 connected in parallel to the pair of load impedances 510, the cross-coupled differential pair 515 having drain inputs and cross-coupled gate inputs connected to the pair of output nodes to supplement a gain of the amplified differential voltage output voltage signal. The method 900 further includes reducing 906 a common mode voltage Vcm of the amplified differential output voltage signal by lowering the amplifier current driving the pair of load impedances 510 via a bias control signal Vbias, the amplifier current lowered responsive to detecting the supplemented gain of the amplified differential output voltage signal.

In some embodiments, the VGA receives a gain control signal, and wherein selectively enabling the cross-coupled differential pair comprises determining the gain control signal is associated with a predetermined gain setting. In such embodiments, the supplemented gain of the amplified differential voltage output voltage signal is adjustable via a control signal Vcc, and the control signal is selected based on the gain control signal. In some embodiments, the gain control signal may be provided to e.g., a look up table, the output of which is a control signal Vcc to enable the current source transistors connected to the cross-coupled differential pair.

Alternatively, as shown in the embodiment of FIG. 2, cross-coupled differential pair may be enabled by detecting an increase in Vcm relative to a target Vcm value (e.g., "uoc" in FIG. 2). In such embodiments, the cross-coupling control signal Vcc may be determined by measuring the common mode voltage Vcm of the amplified differential output signal and comparing Vcm to a threshold voltage uoc to control an amount of the supplemented gain. In some embodiments, the threshold voltage is adjustable. In some embodiments, the threshold voltage is obtained via an external digital loop. In some embodiments, the threshold voltage uoc is obtained from RTL logic. In such embodiments, uoc corresponds to a target common mode voltage that may be obtained by comparing the Vcm of the differential output voltage signal to the common mode voltage of the connected DFE circuit by an auto-zero-comparator. Based on comparison, the digital uoc value is adjusted to match them. In such embodiments, uoc may be a digital value provided to a digital to analog converter. One reason for the cascaded loops is that the digital loop uses an auto-zero-comparator with an offset <1 mV and facilitates addition of a digital offset value if necessary. In some cases, controlling the gate voltage of the NMOS transistors utilizes a digital loop of ~12 bit. In such embodiments, having the analog loop inside, the digital loop can be done with 6 bits of resolution. In some embodiments, Vcm may exceed a threshold when the target output amplitude Vtp of the replica VGA core 225 is increased, thus increasing the amount of bias current generated in the VGA. The cross-coupled device is thus enabled according to a high-bias setting of the VGA 200.

In some embodiments, detecting the supplemented gain of the amplified differential output signal comprises comparing a differential output voltage of a replica variable gain amplifier against a target differential output voltage. In such embodiments, the bias control signal Vbias is generated from the comparison of the differential output voltage of the replica variable gain amplifier against the target differential output voltage. In some embodiments, the target differential output voltage is obtained from a resistor ladder.

I claim:

1. A method comprising:
   receiving a differential input voltage signal at an input of a variable gain amplifier (VGA), and responsively generating an amplified differential output voltage signal on a pair of output nodes by driving a pair of load impedances connected to the pair of output nodes with an amplifier current according to the differential input voltage signal;

receiving a gain control signal at the VGA;

enabling, responsive to a determination that the gain control signal is associated with a predetermined range of gain settings, a cross-coupled differential pair connected in parallel to the pair of load impedances, the cross-coupled differential pair having drain inputs and cross-coupled gate inputs connected to the pair of output nodes to supplement a gain of the amplified differential voltage output voltage signal; and reducing a common mode voltage of the amplified differential output voltage signal by lowering the amplifier current driving the pair of load impedances via a bias control signal, the amplifier current lowered responsive to detecting the supplemented gain of the amplified differential output voltage signal.

2. The method of claim 1, wherein the supplemented gain of the amplified differential voltage output voltage signal is adjustable via a cross-coupling voltage control signal, and wherein the cross-coupling voltage control signal is selected based on the gain control signal.

3. The method of claim 1, further comprising measuring the common mode voltage of the amplified differential output signal, and comparing the common mode voltage to a threshold voltage to control an amount of the supplemented gain.

4. The method of claim 3, wherein the threshold voltage is adjustable.

5. The method of claim 3, wherein the threshold voltage is obtained via an external digital loop.

6. The method of claim 5, wherein the threshold voltage is obtained by comparing the common mode voltage of the amplified differential output signal to a common mode voltage of a decision feedback equalization circuit.

7. The method of claim 1, wherein detecting the supplemented gain of the amplified differential output signal comprises comparing a differential output voltage of a replica variable gain amplifier against a target differential output voltage.

8. The method of claim 7, wherein the bias control signal is generated from the comparison of the differential output voltage of the replica variable gain amplifier against the target differential output voltage.

9. The method of claim 8, wherein the target differential output voltage is obtained from a resistor ladder.

10. An apparatus comprising:
a variable gain amplifier (VGA) configured to receive a differential input voltage signal at an input, and to responsively generate an amplified differential output voltage signal on a pair of output nodes by driving a pair of load impedances connected to the pair of output nodes with an amplifier current according to the differential input voltage signal, the VGA further configured to receive a gain control signal;

a cross-coupled differential pair connected in parallel to the pair of load impedances, the cross-coupled differential pair having drain inputs and cross-coupled gate inputs connected to the pair of output nodes to supplement a gain of the amplified differential voltage output voltage signal, the cross-coupled differential pair selectively enabled to reduce a common mode voltage of the amplified differential output voltage signal by lowering the amplifier current driving the pair of load impedances via a bias control signal, the amplifier current lowered responsive to detecting the supplemented gain of the amplified differential output voltage signal, the cross-coupled differential pair enabled responsive to a determination that the gain control signal is associated with a predetermined range of gain settings.

11. The apparatus of claim 10, wherein the supplemented gain of the amplified differential voltage output voltage signal is adjustable via a cross-coupling voltage control signal, and wherein the control signal is selected based on the gain control signal.

12. The apparatus of claim 10, further comprising a cross-coupling voltage control signal generator configured to measure the common mode voltage of the amplified differential output signal, and to compare the common mode voltage to a threshold voltage to control an amount of the supplemented gain.

13. The apparatus of claim 12, wherein the threshold voltage is adjustable.

14. The apparatus of claim 12, wherein the threshold voltage is obtained via an external digital loop.

15. The apparatus of claim 14, wherein the threshold voltage is obtained by comparing the common mode voltage of the amplified differential output signal to a common mode voltage of a decision feedback equalization circuit.

16. The apparatus of claim 10, further comprising:
a replica VGA configured to generate a differential output voltage based on a replica bias control signal;
a voltage generator configured to generate a variable target differential output voltage; and
a replica bias control signal generator configured to detect the supplemented gain of the amplified differential output signal by forming a comparison of the differential output voltage of the replica VGA to the target differential output voltage, and to responsively generate the replica bias control signal from the comparison of the differential output voltage of the replica VGA to the target differential output voltage.

17. The apparatus of claim 16, wherein the replica VGA is configured to the generate the differential output voltage based further on a differential reference voltage, the differential reference voltage selected from the voltage generator.

18. The apparatus of claim 16, wherein the voltage generator is a resistor ladder.

\* \* \* \* \*